(12) United States Patent
Beyer et al.

(10) Patent No.: US 7,893,503 B2
(45) Date of Patent: Feb. 22, 2011

(54) SEMICONDUCTOR DEVICE COMPRISING NMOS AND PMOS TRANSISTORS WITH EMBEDDED SI/GE MATERIAL FOR CREATING TENSILE AND COMPRESSIVE STRAIN

(75) Inventors: Sven Beyer, Dresden (DE); Manfred Horstmann, Duerrroehrsdorf-Dittersbach (DE); Patrick Press, Dresden (DE); Wolfgang Buchholtz, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/754,819

(22) Filed: Apr. 6, 2010

(65) Prior Publication Data

US 2010/0187635 A1    Jul. 29, 2010

Related U.S. Application Data

(62) Division of application No. 11/748,902, filed on May 15, 2007, now Pat. No. 7,741,167.

(30) Foreign Application Priority Data

Oct. 31, 2006    (DE) .................... 10 2006 051 492

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................... 257/369; 257/374; 257/391; 257/E27.06; 257/27.062

(58) Field of Classification Search ................. 257/338, 257/351, 369, 374, 391, 392, E27.06, E27.062
See application file for complete search history.

(56) References Cited

U.S. PATENT DOCUMENTS 6,903,384 B2 * 6/2005 Hsu et al. .................... 257/192

* cited by examiner

*Primary Examiner*—Hoai v Pham
(74) *Attorney, Agent, or Firm*—Williams, Morgan & Amerson

(57) ABSTRACT

By forming a substantially continuous and uniform semiconductor alloy in one active region while patterning the semiconductor alloy in a second active region so as to provide a base semiconductor material in a central portion thereof, different types of strain may be induced, while, after providing a corresponding cover layer of the base semiconductor material, well-established process techniques for forming the gate dielectric may be used. In some illustrative embodiments, a substantially self-aligned process is provided in which the gate electrode may be formed on the basis of layer, which has also been used for defining the central portion of the base semiconductor material of one of the active regions. Hence, by using a single semiconductor alloy, the performance of transistors of different conductivity types may be individually enhanced.

9 Claims, 12 Drawing Sheets

SEMICONDUCTOR DEVICE COMPRISING NMOS AND PMOS TRANSISTORS WITH EMBEDDED SI/GE MATERIAL FOR CREATING TENSILE AND COMPRESSIVE STRAIN

This application is a divisional of Ser. No. 11/748,902, filed May 15, 2007 now U.S. Pat. No. 7,741,167.

BACKGROUND OF THE INVENTION

1. Field of the Invention

Generally, the present disclosure relates to the fabrication of integrated circuits, and, more particularly, to the formation of transistor having strained channel regions by using embedded silicon/germanium (Si/Ge) so as to enhance charge carrier mobility in the channel regions of the transistors.

2. Description Of The Related Art

The fabrication of complex integrated circuits requires the provision of a large number of transistor elements, which are used in logic circuits as efficient switches and which represent the dominant circuit element for designing logic circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates, to design highly complex circuit assemblies, such as CPUs, storage chips and the like. During the fabrication of complex integrated circuits using CMOS technology, millions of transistors, i.e., N-channel transistors and P-channel transistors, are formed on a substrate including a crystalline semiconductor layer.

A field effect transistor or MOS transistor, irrespective of whether an N-channel transistor or a P-channel transistor is considered, comprises so-called PN junctions that are formed by an interface of highly doped drain and source regions with an inversely doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity in combination with a desired channel controllability. Moreover, the gate dielectric material may also be adapted to the reduced channel length in order to maintain the required channel controllability. However, some mechanisms for obtaining a high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby offering the potential for achieving a performance improvement that is comparable with the advance to a future technology node while avoiding or at least postponing many of the process adaptations associated with device scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium layer next to the channel region to induce a compressive stress that may result in a corresponding strain. The transistor performance of P-channel transistors may be considerably enhanced by the introduction of stress-creating layers next to the channel region. For this purpose, a strained silicon/germanium (Si/Ge) layer may be formed in the drain and source regions of the transistors, wherein the compressively strained drain and source regions create uniaxial strain in the adjacent silicon channel region. When forming the Si/Ge layer, the drain and source regions of the PMOS transistors are selectively recessed, while the NMOS transistors are masked, and subsequently the silicon/germanium layer is selectively formed in the PMOS transistor by epitaxial growth. Although this technique offers significant advantages in view of performance gain of the PMOS transistor and thus of the entire CMOS device, an appropriate design may have to be used that balances the difference caused by the performance gain of the PMOS transistor, while the NMOS transistor may not efficiently contribute to the overall device performance.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a semiconductor device including different types of active regions, wherein a different type of strain may be induced, at least at a channel area positioned close to the respective gate insulation layer, by providing a semiconductor alloy in the active regions, which, in illustrative embodiments, may be formed on the basis of the same atomic species in the different active regions. Thus, efficient strain-inducing mechanisms for different transistor types, such as N-channel transistors and P-channel transistors, may be accomplished on the basis of embedded semiconductor alloys in combination with a silicon-based material, wherein a single type of semiconductor alloy may be sufficient for obtaining a respective performance gain for both types of transistors. Consequently, an increased overall performance gain may achieve superior balance in performance gain between N-channel and P-channel devices compared to conventional approaches, in which a silicon/germanium alloy is used to exclusively enhance the performance of P-channel transistors.

According to one illustrative embodiment disclosed herein, a semiconductor device comprises a first transistor of a first conductivity type comprising a first active region having formed thereabove a first gate electrode. The first active region comprises a substantially continuous semiconductor alloy extending laterally between an isolation structure that borders the first active region. The first active region further comprises a layer of semiconductor material formed on the first semiconductor alloy, wherein the first semiconductor alloy generates a first type of strain in the layer of semiconductor material. The semiconductor device further comprises a second transistor of a second conductivity type that comprises a second active region having formed thereabove a second gate electrode. The second active region comprises a second semiconductor alloy provided in a first portion and a second portion, which are separated by a region formed from the semiconductor material, wherein the first and second portions generate a second type of strain in the region formed therebetween.

According to another illustrative embodiment disclosed herein, a method comprises forming a semiconductor alloy in a first active region and a second active region of a semiconductor device. Furthermore, a part of the semiconductor alloy is selectively removed in the second active region to define a central region formed between a first portion and a second portion of the semiconductor alloy. The method further comprises forming a layer of semiconductor material on at least a portion of the first active region and filling the central region with the semiconductor material.

According to yet another illustrative embodiment disclosed herein, a method comprises forming a layer of a first semiconductor alloy that is defined by two atomic species in a first active region of a semiconductor device. Furthermore, a layer of semiconductor material is formed on the first active region that comprises the layer of the first semiconductor alloy. The method further comprises forming a first and a second recess in a second active region of the semiconductor device so as to define a central region of semiconductor material in the second active region. Finally, the first and the second recesses are filled with a second semiconductor alloy that is defined by the two atomic species.

BRIEF DESCRIPTION OF THE DRAWINGS

The disclosure may be understood by reference to the following description taken in conjunction with the accompanying drawings, in which like reference numerals identify like elements, and in which.

Figure 1A:
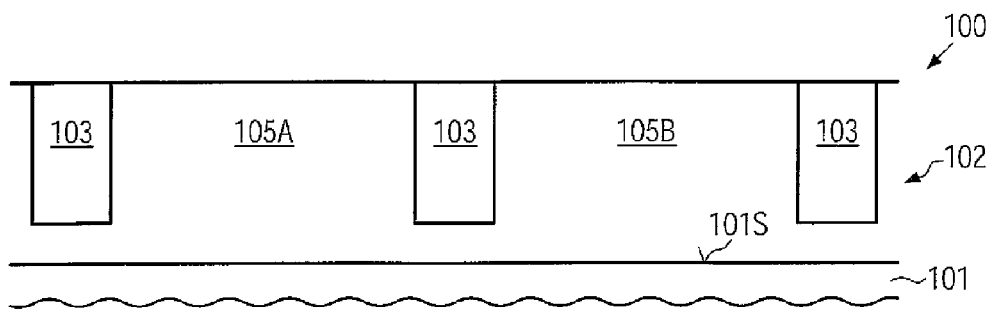
FIGS. 1a-1j schematically illustrate cross-sectional views of a semiconductor device during various manufacturing stages in forming differently strained active regions on the basis of a semiconductor alloy according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for creating different types of strain in different active regions on the basis of an embedded semiconductor alloy in order to individually enhance transistor performance of different transistor types. As previously explained, silicon/germanium material, which represents a frequently used semiconductor alloy for providing strain in P-channel transistors, may also be effectively used for obtaining a respective strain for N-channel transistors so that well-established process techniques developed for P-channel transistors may be efficiently used for enhancing the charge carrier mobility in N-channel transistors. Thus, in some illustrative embodiments, an embedded semiconductor alloy in the form of silicon/germanium may be used in an appropriate configuration so as to induce a tensile stain, at least in an upper portion of a respective channel region of the N-channel transistor, while, on the other hand, a respective compressive strain may be created in the channel region of the P-channel transistor. In the case of silicon/germanium, well-established selective epitaxial growth techniques may be used in combination with advanced masking regimes in order to provide the semiconductor alloy in an appropriate configuration for inducing the desired type of strain while also providing a high degree of process compatibility with conventional process techniques. In this respect, in some illustrative embodiments, the semiconductor alloy may be formed in both active regions in a common process sequence and, thereafter, in one of the active regions, a corresponding patterning sequence may be performed in order to form a desired geometrical configuration of semiconductor alloy and base semiconductor material for obtaining a desired difference in the respective induced strains in the different active regions.

For example, by providing a substantially continuous silicon/germanium alloy in the active region of an N-channel transistor and forming thereon a silicon-based material, a high degree of tensile strain may be induced, at least in the upper semiconductor material, thereby significantly enhancing the electron mobility. On the other hand, the silicon/germanium alloy in the active region of the P-channel transistor may be appropriately patterned and refilled with the semiconductor material, which may then experience a high degree of compressive strain so as to enhance the hole mobility therein. In other process regimes, the respective semiconductor alloys in the different active regions may be formed in separate process sequences, thereby providing increased process flexibility. In further illustrative embodiments, a corresponding masking regime may be used for selectively recessing a semiconductor alloy in one of the active regions, wherein a corresponding mask regime may also be used for forming respective gate electrodes, thereby obtaining a high degree of alignment of the corresponding gate electrodes with the underlying strained portion of semiconductor material, at least in one of the active regions. On the basis of the process regimes described above and described later on in more detail, an efficient strain-inducing mechanism may be provided, which may even be combined with additional techniques, such as stressed overlayers, stressed sidewall spacers and the like, in order to even further enhance the overall device performance.

It should be appreciated that the subject matter disclosed herein is highly advantageous in combination with a silicon/germanium semiconductor alloy since, for this material, a plurality of well-established selective epitaxial growth techniques are available. As will be explained later on in more detail, the principles disclosed herein may also be applied to any type of semiconductor alloy, such as silicon/carbon and the like, wherein the corresponding difference in strain may also be accomplished either with an inverse geometrical configuration compared to embodiments in which a silicon/germanium material may be used. It should further be appreciated that in addition to or alternatively to selective epitaxial growth techniques, other processes for forming a semiconductor alloy, such as implantation, may be used in combination with the subject matter disclosed herein, wherein substantially the same masking regimes may be used. In this case, one or more of the respective epitaxial growth processes may be replaced by a corresponding ion implantation process. For example, silicon/carbon alloys may be effectively generated on the basis of an ion implantation process in combination with sophisticated pre-amorphization recipes and anneal techniques, thereby rendering silicon/carbon a very promising semiconductor alloy in combination with the present disclosure, even though respective epitaxial growth techniques for this alloy may currently be difficult to be implemented in current CMOS processes.

Referring to FIGS. 1a-1j, respective embodiments will now be described, in which a semiconductor alloy of a specific type, such as silicon/germanium, may be formed in a common process sequence in a first and a second active region, wherein, in a later manufacturing stage, a semiconductor material, such as silicon, may be formed on one of the active regions as a substantially continuous layer, while, in the second active region, an area corresponding to a gate electrode may receive the semiconductor material.

FIG. 1a schematically illustrates a semiconductor device 100 comprising a substrate 101, which may represent any appropriate carrier material for having formed thereon a semiconductor layer 102. In some illustrative embodiments, the substrate 101 may represent a silicon-on-insulator (SOI) substrate, which may comprise any appropriate carrier material, such as silicon including a buried insulating layer, such as a buried silicon dioxide layer (not shown) on which may be formed the semiconductor layer 102, which, in some illustrative embodiments, may be represented by a silicon material. In other illustrative embodiments, the substrate 101 may represent a semiconductor bulk substrate, an upper portion of which may form the semiconductor layer 102. In this respect, it should be appreciated that any positional statement, such as "above," "below," "lateral," "vertical" and the like, is to be understood as a relative position information with respect to the substrate 101, which may be considered as a reference. In this sense, the semiconductor layer 102 may be located "above" the substrate 101 and may extend "laterally," indicating that the semiconductor layer 102 extends parallel to a surface 101S of the substrate 101. Similarly, a thickness of the semiconductor layer 102 may indicate an extension of the semiconductor layer 102 in a direction that is substantially perpendicular to the surface 101S.

The semiconductor device 100 may further comprise, at this manufacturing stage, a plurality of isolation structures 103, such as a shallow trench isolation and the like, which may be formed in the semiconductor layer 102 so as to border and, thus, to define a first active region 105A and a second active region 105B. In this respect, an active region is to be understood as a semiconductor region having formed therein, or receiving, a specific dopant distribution for correspondingly adjusting the conductivity. In the context of the present disclosure, an active region may even further be understood as a semiconductor region having formed therein or receiving a dopant profile so as to form a PN junction at specific areas within the active region. For example, in the embodiment shown in FIG. 1a, the active regions 105A, 105B may have incorporated therein a respective dopant concentration so as to provide a P-type conductivity and an N-type conductivity, respectively. For example, the first active region 105A may represent the active region for an N-channel transistor and may therefore have incorporated therein a P-type dopant. Similarly, in this case, the second active region 105B may have incorporated therein an N-dopant so as to provide an N-type conductivity appropriate for forming therein a P-channel transistor. Moreover, other configurations may be contemplated in other illustrative embodiments.

The semiconductor device 100 as shown in FIG. 1a may be formed on the basis of well-established process techniques, such as the patterning of respective trenches and a subsequent refilling of the trenches with an appropriate dielectric material, such as silicon dioxide, silicon nitride and the like.

Figure 1B:
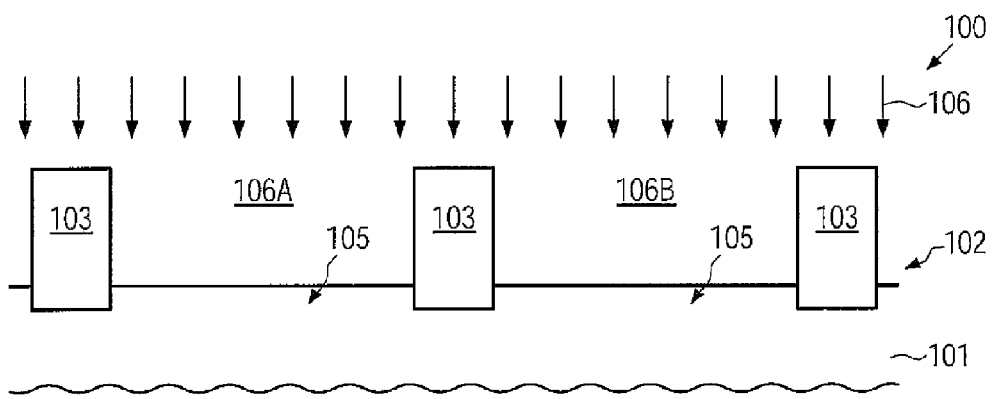

FIG. 1b schematically illustrates the semiconductor device 100 in a further advanced manufacturing stage. Here, the device 100 is exposed to a selective etch ambient 106 for selectively removing material from the first and second active regions 105A, 105B in order to provide respective openings 106A, 106B. The etch process 106 may be performed on the basis of well-established recipes in order to selectively remove the material of the regions 105A, 105B with respect to the isolation structures 103. For instance, highly selective etch recipes are available for silicon with respect to silicon dioxide, silicon nitride and the like. The etch process 106 may be controlled such that at least some of the base material of the semiconductor layer 102 may be maintained. Thus, a corresponding crystalline template layer, indicated as 105, may remain in order to provide a corresponding semiconductor matrix for epitaxially growing a corresponding semiconductor alloy in a subsequent process step. It should be appreciated that, in an SOI configuration, the semiconductor layer 102 may be bordered in the horizontal direction by a buried insulating layer (not shown) and the isolation structure 103 may extend down to the buried insulating layer. In this case, the etch process 106 may be stopped prior to exposing the buried insulating layer, while, in a bulk configuration, the corresponding control of the etch process 106 may be less critical since the material of the substrate 101 may also act as a corresponding template material. After the formation of the respective openings 106A, 106B, appropriate process steps may be performed in order to prepare the surface of the template layer 105 for a subsequent epitaxial growth process. For example, well-established process recipes are available for silicon/germanium, in which the epitaxial growth of the deposited silicon/germanium material may be substantially restricted to the exposed surface of the template layer 105, while a significant material deposition on other exposed surface portions, such as the isolation structures 103, is significantly suppressed.

Figure 1C:
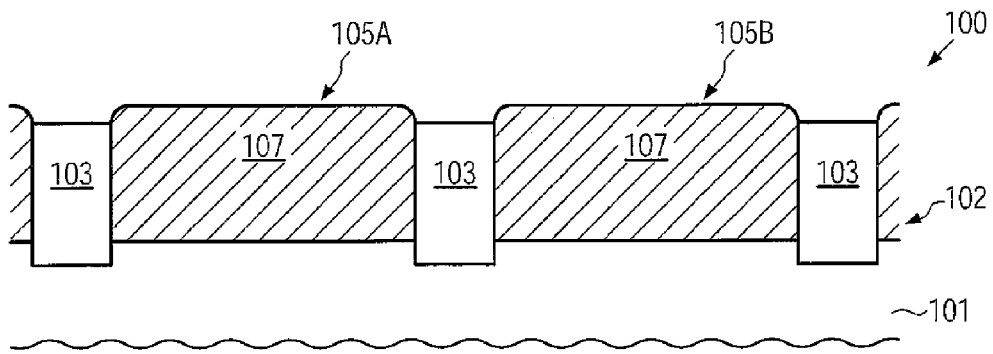

FIG. 1c schematically illustrates the semiconductor device 100 after the above-described selective epitaxial growth process. Hence, the device 100 comprises a semiconductor alloy 107 in the first and second active regions 105A, 105B which, in one illustrative embodiment, may be comprised of silicon/germanium. In one illustrative embodiment, the semiconductor alloy 107 may be provided in the form of a substantially intrinsic semiconductor material, wherein a required dopant profile in the active regions 105A, 105B may be provided on the basis of an ion implantation process based on a corresponding mask regime, as may also be used in conventional devices, when respective active regions are defined. In other illustrative embodiments, the semiconductor alloy 107 may be deposited in the form of an in situ doped material in order to provide a basic dopant concentration that is appropriate for at least one of the active regions 105A, 105B. Subsequently, a corresponding implantation process may be performed in order to introduce a sufficient amount of counter dopants in the other one of the active regions 105A, 105B so as to provide the desired type of conductivity. In some illustrative embodiments, the semiconductor alloy 107 may have a varying concentration of atomic species, for instance the ratio of silicon and germanium atoms may vary in the vertical direction in order to obtain the desired strain characteristics. For instance, the germanium concentration may be increased from bottom to top, thereby also increasing the amount of lattice mismatch with respect to the template layer 105 so that the number of crystalline defects during the epitaxial growth process may be maintained at a low level. However, in other cases, any vertical concentration profile may be created during the selective epitaxial growth process, depending on the device requirements.

Figure 1D:
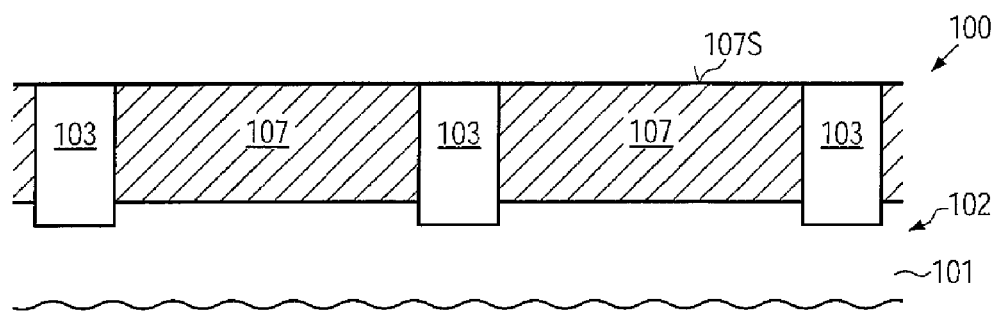
Figure 1E:
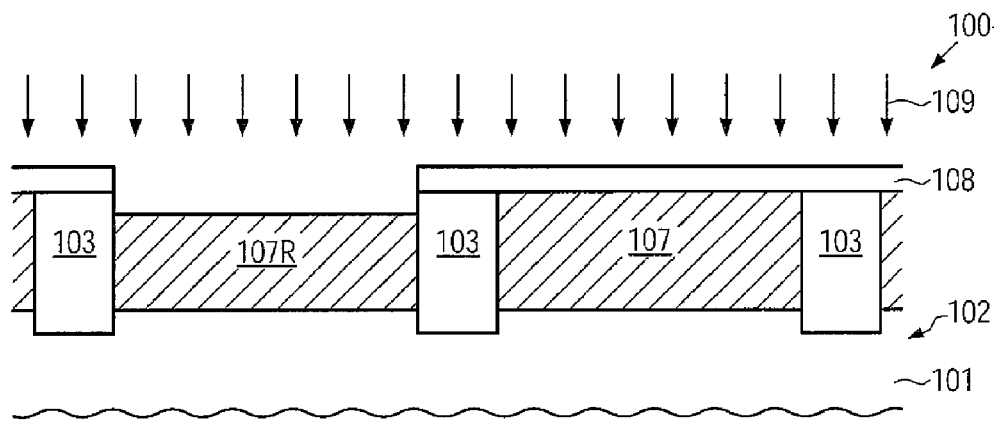

FIG. 1d schematically illustrates the semiconductor device 100 after a planarization process, for instance performed on the basis of a chemical mechanical polishing (CMP) process, thereby efficiently removing any excess material of the semiconductor alloy 107. Furthermore, a substantially planar surface topography 107S may be provided for the further processing of the device 100.

FIG. 1a schematically illustrates the semiconductor device 100 in a further advanced manufacturing stage. At this stage, a mask layer 108 may be formed to cover the second active region 105B while exposing the first active region 105A to an etch ambient 109. During the etch process 109, a portion of the exposed semiconductor alloy material 107 in the first active region 105A may be removed down to a specified depth, which may be selected such that subsequently a sufficient thickness of a layer of semiconductor material, such as silicon, may be obtained in a later manufacturing stage which may be formed on the recessed portion 107R of the semiconductor alloy 107. The etch process 109 may be performed on the basis of well-established process recipes, in which the semiconductor alloy 107 may be selectively removed with respect to the mask layer 108, which may be comprised of any appropriate dielectric material, such as silicon nitride, silicon dioxide and the like. The mask layer 108 may be formed and patterned on the basis of well-established techniques, for instance including the deposition of an appropriate mask material by chemical vapor deposition (CVD) and a photolithography process for correspondingly patterning the mask layer 108 on the basis of a resist mask.

Figure 1F:
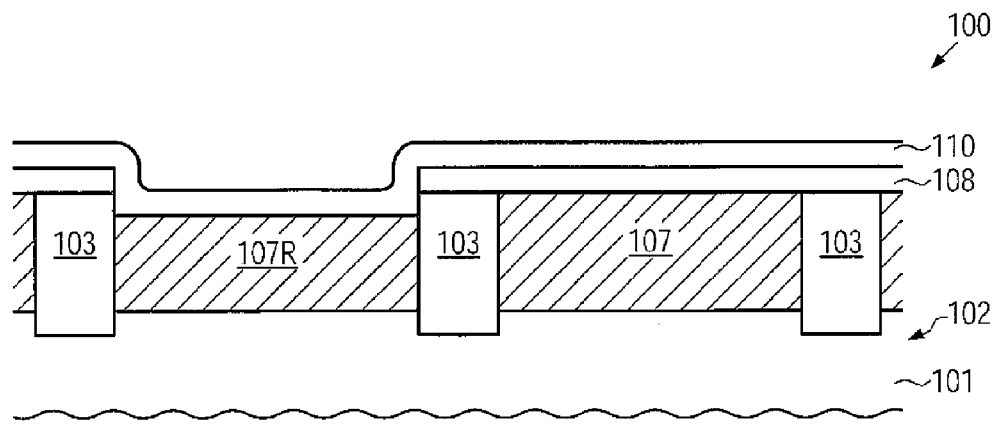

FIG. 1f schematically illustrates the semiconductor device 100 with an additional mask layer 110, which may be comprised of any appropriate material, such as silicon nitride, silicon dioxide and the like. In one illustrative embodiment, the mask layer 110 may be comprised of a material having a high etch selectivity with respect to the material of the mask layer 108. For instance, the mask layer 110 may be provided as a silicon dioxide material, when the layer 108 may be comprised of silicon nitride. Thereafter, the mask layers 108 and 110 may be patterned in order to define a respective opening above the second active region 105B, which may be accomplished on the basis of a correspondingly designed lithography process.

Figure 1G:
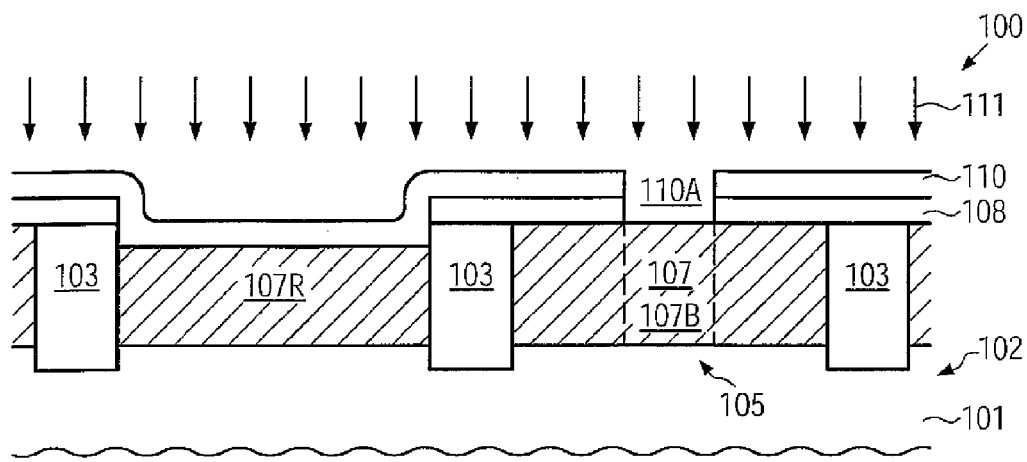

FIG. 1g schematically illustrates the semiconductor device 100 after the corresponding patterning process, so that a corresponding opening 110A may expose a portion of the semiconductor alloy 107 in the second active region 105B. In one illustrative embodiment, the opening 110A may substantially correspond in size and position to a gate electrode to be formed above the second active region 105B in a later manufacturing stage. In other illustrative embodiments, the size of the opening 110A, that is the horizontal dimension of the opening 110A in FIG. 1g, may be selected to be greater than a corresponding gate length in order to provide a sufficient process margin in order to accommodate alignment uncertainties during later manufacturing processes for forming the respective gate electrode. In other cases, an increased lateral dimension of the opening 110A may provide a higher degree of compatibility in forming a respective gate insulation layer which may then extend beyond respective sidewalls of a gate electrode still to be formed, wherein the respective characteristics of the gate insulation layer, even at the sidewalls of the corresponding gate electrode, may be provided substantially independently from the characteristics of the semiconductor alloy 107. For instance, if a respective gate insulation layer is to be formed on the basis of an oxidation process, the respective oxide may be reliably formed with high quality even in the area of the sidewalls of the gate electrode, as will be explained later on in more detail.

Furthermore, the semiconductor device 100 is exposed to an etch ambient 111 for removing a portion of the semiconductor alloy 107 on the basis of the opening 110A, thereby defining a central region 107B in the second active region 105B that may receive a semiconductor material in a subsequent process step. In some illustrative embodiments, the etch process 111 is controlled such that a corresponding opening may be formed down to the template layer 105, while, in other embodiments, the depth of the resulting opening is less critical, since any remaining material of the semiconductor alloy 107 may have substantially the same lattice spacing compared to the template material 105, thereby providing a crystalline template having substantially the same crystallographic characteristics with respect to lattice spacing compared to the template layer 105.

Figure 1H:
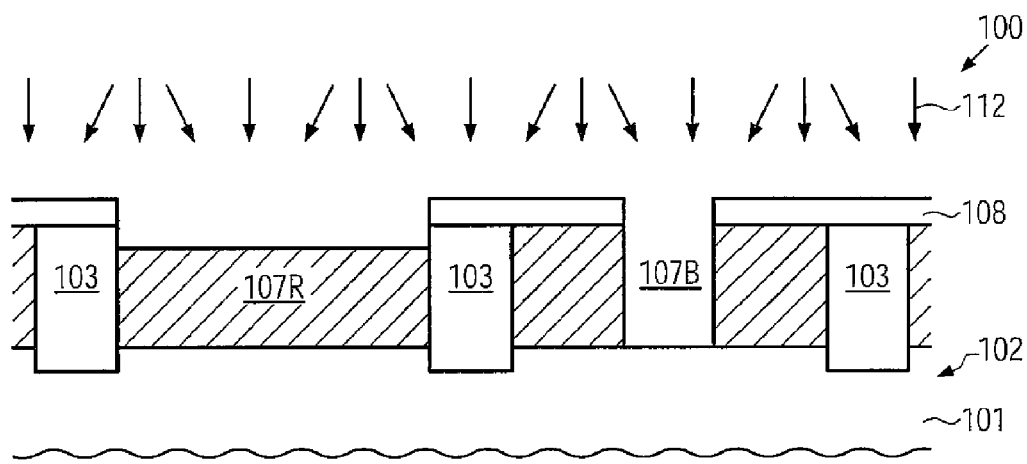

FIG. 1h schematically illustrates the semiconductor device 100 in a further advanced manufacturing stage. Here, the opening 107B is formed in the semiconductor alloy 107 to define the respective central region. Furthermore, the mask layer 110 may be removed to expose the first active region 105A. To this end, a corresponding selective etch process may be performed, wherein the material of the mask layer 110 may be selectively removed with respect to the layer 108 and with respect to the material of the template layer 105. For example, respective selective etch recipes for silicon dioxide, silicon nitride and silicon are well established in the art. Moreover, the device 100 may be subjected to a selective epitaxial growth process 112 in order to refill the opening 107B with a semiconductor material, such as silicon, while also growing a respective semiconductor material above the semiconductor alloy having the reduced thickness, indicated as 107R, in the first active region 105A. During the selective epitaxial growth process 112, the crystalline semiconductor alloy 107R may act as a template, wherein, depending on the degree of lattice mismatch between the underlying template layer 105, the newly deposited semiconductor material, such as silicon, may be deposited so as to substantially take on the crystallographic configuration given by the material 107R, thereby endowing a certain degree of strain to the newly grown semiconductor material. For example, when the semiconductor alloy 107R is substantially comprised of silicon/germanium, which is grown on the template layer 105, i.e., on a substantially undistorted silicon material, the semiconductor alloy may have a slightly reduced lattice spacing compared to its natural lattice spacing. Hence, the semiconductor alloy 107R may have the tendency to expand and may thus transfer a corresponding stress into the newly grown semiconductor material, which may therefore receive a certain degree of tensile strain, which may be advantageous for increasing the electron mobility in the corresponding grown semiconductor layer. On the other hand, the semiconductor material increasingly growing within the opening 107B may take on a compressively strained crystallographic configuration due to the template material 105 and the moderately strained semiconductor alloy 107. Thus, in the newly grown semiconductor material within the opening 107B, an increase of hole mobility may be obtained for the above-specified situation. In other cases, when the semiconductor alloy 107R, 107 may represent a material composition having a natural lattice spacing that is less compared to the natural lattice spacing of silicon, the induced strain may have the inverse configuration, that is, the semiconductor material in the first active region 105A may receive a compressive strain, while the region 107B may be re-grown with a tensile strain. For instance, silicon/carbon may be used in this case.

Figure 1I:
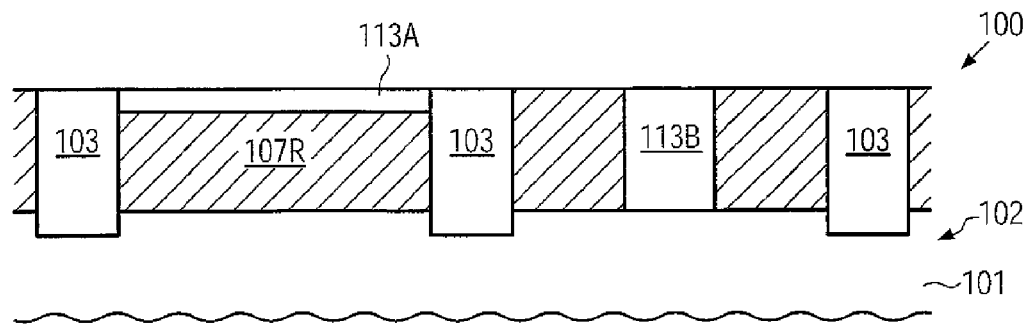

FIG. 1i schematically illustrates the semiconductor device 100 at a further advanced manufacturing stage. As shown, a layer of semiconductor material 113A is formed on the semiconductor alloy 107R and a corresponding semiconductor material 113B is formed within the central region 107B, which will now also be referred to as region 113B. Furthermore, the mask layer 108 may be removed and the resulting surface topography may have been planarized, for instance on the basis of a CMP process. During the corresponding planarization and removal of the mask layer 108, any excess material generated during the previously performed epitaxial growth process 112 may also be efficiently removed. Thereafter, any required process steps may be performed, for instance, with respect to establishing a desired vertical dopant profile within the active regions 105A, 105B, wherein respective masking regimes may be used, as are also typically employed in conventional process regimes. Consequently, a silicon-based semiconductor material in the form of the layer 113A and in the second active region 105B in the form of the material 113B, at least in the central region, may be provided for the further processing, thereby providing a high degree of compatibility with conventional CMOS regimes. Consequently, well-established gate patterning processes including the fabrication of a desired gate insulation layer on the basis of oxidation and/or deposition may be applied.

Figure 1J:
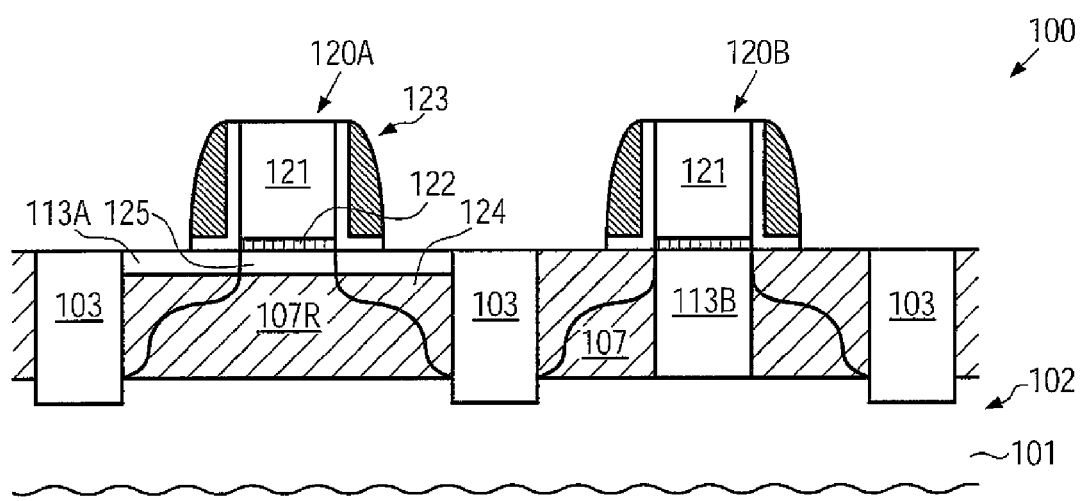

FIG. 1j schematically illustrates the semiconductor device 100 at a further advanced manufacturing stage. As shown, a first transistor 120A is formed in and above the first active region 105A, while a second transistor 120B is formed in and above the second active region 105B. The transistors 120A, 120B are of different conductivity type and may represent an N-channel transistor and a P-channel transistor, respectively, while the semiconductor alloys 107R and 107 provide strain in the respective active areas in order to enhance electron mobility and hole mobility, respectively. The first and second transistors 120A, 120B may comprise a gate electrode 121 formed above a respective channel region 125 with a corresponding gate insulation layer 122 electrically insulating the gate electrode 121 from the channel region 125. Furthermore, an appropriate sidewall spacer structure 123 may be provided, depending on the process requirements, and respective drain and source regions 124 may be defined within the active regions 105A, 105B. As previously explained, the manufacturing sequence for forming the transistors 120A, 120B may be based on conventional CMOS processes, since, in particular, forming the gate insulation layers 122 and the gate electrodes 121 may be performed on the basis of well-established recipes. Thereafter, the drain and source regions 124 may be formed on the basis of an appropriate implantation sequence, possibly in combination with a respective intermediate manufacturing state of the sidewall spacer 123 so as to obtain the required lateral and vertical dopant profile. It should be appreciated that the modified configurations of the active regions 105A, 105B may be taken into consideration when designing respective implantation processes for obtaining the desired dopant profile.

Thereafter, any further manufacturing processes may be performed, for instance metal silicide regions (not shown) may be provided in the drain and source regions 124 and the gate electrode 121, if required. Due to the semiconductor layer 113A, a corresponding process sequence as in conventional devices may be used for the transistor 120A, while for the transistor 120B, well-established process techniques may be applied, which are used for CMOS enhancement on the basis of embedded silicon/germanium material, when the semiconductor alloy 107R, 107 may be comprised of silicon and germanium. Even for other semiconductor alloys, for example, atomic species having a greater covalent radius compared to germanium or having a reduced covalent radius compared to silicon, a high degree of process compatibility may nevertheless be maintained, since the respective gate insulation layers may nevertheless be formed on the basis of well-established process conditions, even for the second transistor 120B. Thus, an individual transistor performance gain may be achieved for the first and second transistors 120A, 120B on the basis of a single type of semiconductor alloy while not unduly contributing to process complexity.

With reference to FIGS. 2a-2f, further illustrative embodiments will now be described, in which an increased degree of flexibility may be achieved due to a separate deposition of semiconductor material in a first transistor compared to a deposition of the semiconductor material in a central region of a second transistor.

Figure 2A:
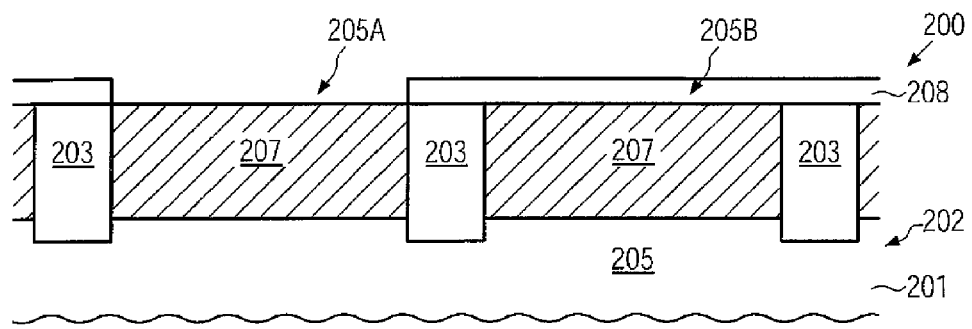
FIGS. 2a-2f schematically illustrate cross-sectional views of a semiconductor device during various manufacturing stages in forming differently strained active regions, wherein an upper semiconductor layer is formed in one active region and subsequently a central portion of semiconductor material is formed in the other type of active region according to illustrative embodiments.

FIG. 2a schematically illustrates a semiconductor device 200 comprising a substrate 201 having formed thereabove a semiconductor layer 202, in which respective isolation structures 203 are provided, which define a first active region 205A and second active region 205B. The first and the second active regions 205A, 205B may comprise a semiconductor alloy 207, which, in some illustrative embodiments, may be formed on a respective template layer 205 representing a crystalline material of the semiconductor layer 202. With respect to the components of the semiconductor device 200 described so far, substantially the same criteria may apply as are previously explained with reference to the semiconductor device 100. Thus, a more detailed description of these components may be omitted here. Furthermore, a mask layer 208 may be formed above the first and second active regions 205A, 205B, wherein the mask layer 208 may expose the semiconductor alloy 207 in the first active region 205A while covering the alloy 207 in the second active region 205B.

A typical process flow for forming the semiconductor device 200 as shown in FIG. 2a may comprise similar processes as are also described with reference to the device 100 as shown in FIGS. 1a-1d. With respect to providing the semiconductor alloy 207, it is also to be noted that any appropriate material composition may be selected in order to obtain the desired stain characteristics within the first and second active regions 205A, 205B. Therefore, any appropriate selective epitaxial growth regime may be used for forming an appropriate semiconductor alloy, such as silicon/germanium, silicon/carbon and the like. In other illustrative embodiments, the semiconductor alloy 107 may be formed on the basis of ion implantation, wherein the semiconductor layer 202 may be exposed to an amorphization implantation, for instance on the basis of silicon, in order to substantially amorphize the corresponding semiconductor material, such as silicon, down to a depth that substantially corresponds to a height position of the template layer 205. Thereafter, an appropriate atomic species, such as carbon, may be introduced by ion implantation with an appropriate dose and energy in order to provide a moderately high concentration in the first and second active regions 205A, 205B. Since ion implantation may be performed on the basis of a resist mask for providing a desired lateral profile of the implanted species, different concentrations and concentration gradients may be readily generated in the first and the second active regions 205A, 205B. After the respective introduction of an atomic species for modifying the lattice structure, wherein the corresponding implantation sequence may also comprise a respective incorporation of an appropriate dopant species, the semiconductor device 200 may be subjected to an anneal process for re-crystallizing the substantially amorphized portion including the atomic species in order to obtain the semiconductor alloy 207 as shown in FIG. 2a. Thereafter, the mask layer 208 may be formed on the basis of well-established techniques.

Figure 2B:
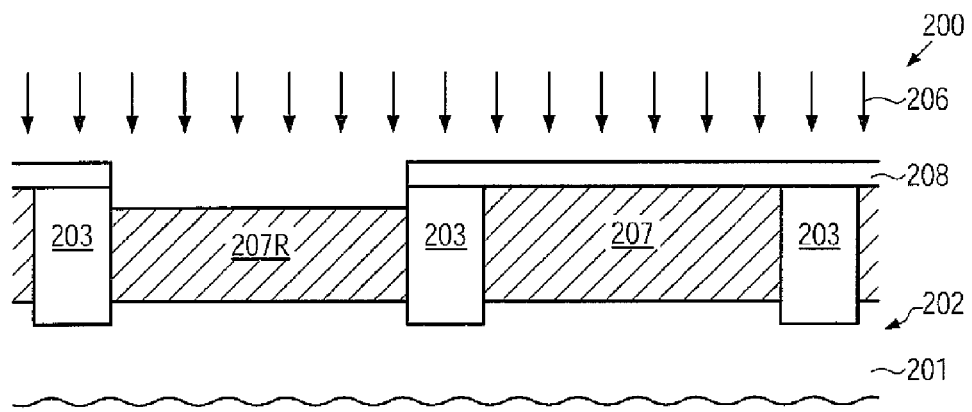

FIG. 2b schematically illustrates the semiconductor device 200 during an etch process 206 for selectively removing a portion of the semiconductor alloy 207 in the first active region 205A, referred to as 207R.

Figure 2C:
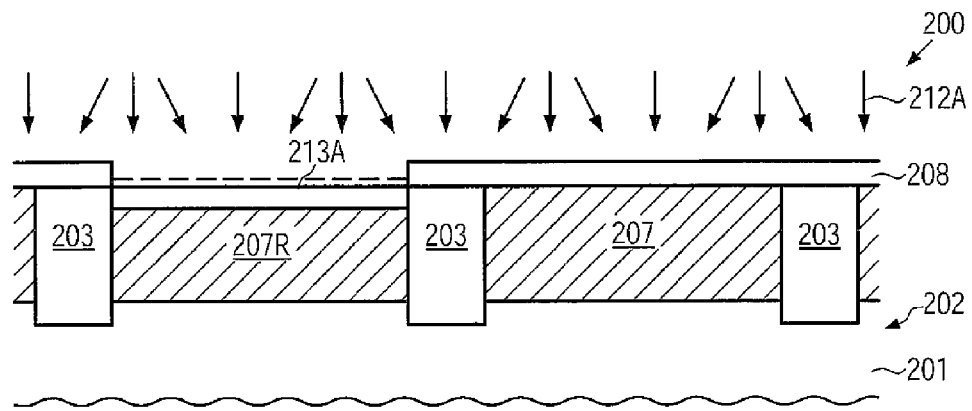

FIG. 2c schematically illustrates the semiconductor device 200 during a selective epitaxial growth process 212A, in which a desired amount of semiconductor material may be grown on the semiconductor alloy 207R. As previously explained, depending on the characteristics of the semiconductor alloy 207R, a corresponding strain may be induced in the newly grown semiconductor material 213A. The growth process 212A may be controlled so as to result in a corresponding excess thickness, as is indicated by the dashed line, when additional material for the layer 213A may be considered appropriate for the further processing of the device 200. For instance, the mask layer 208 may be removed on the basis of a selective etch process and/or a CMP process, wherein excess material of the layer 213A may provide enhanced layer integrity during these process sequences.

Figure 2D:
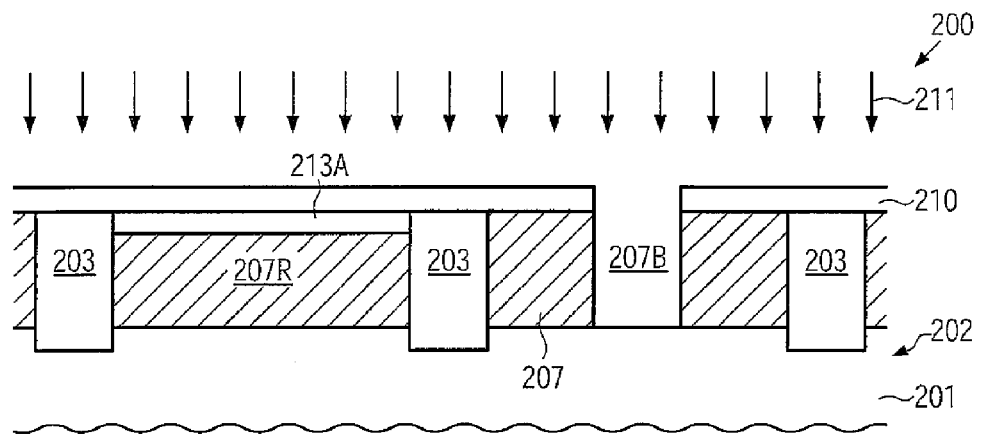

FIG. 2d schematically illustrates the semiconductor device 200 at a further manufacturing stage, wherein a further mask layer 210 is provided, for instance in the form of a silicon nitride layer and the like, which may define a central region or opening 207B in the second active region 205B, while the first active region 205A is covered by the mask layer 210. Furthermore, the device is exposed to an etch ambient 211 in order to remove a portion of the semiconductor alloy 207 in the central region 207B, which may substantially correspond to the position at which a corresponding gate electrode has to be formed in a later manufacturing stage.

Figure 2E:
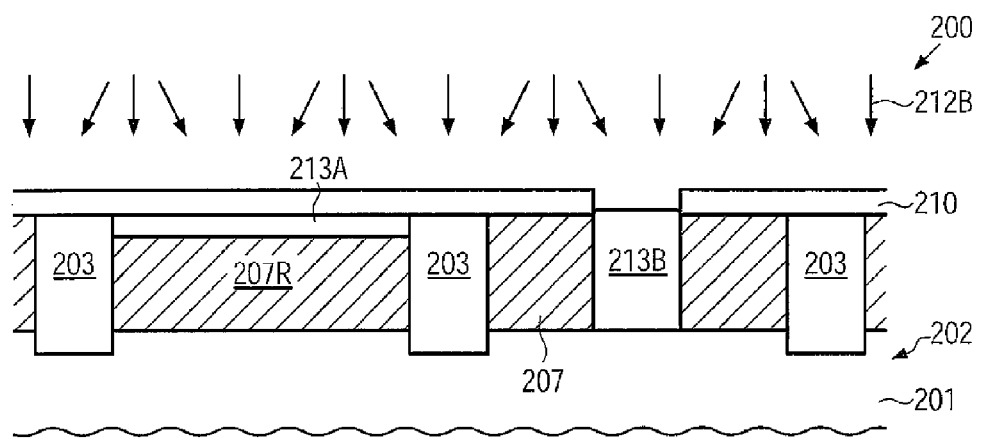

FIG. 2e schematically illustrates the semiconductor device 200 during a selective epitaxial growth process for refilling the central region 207B with an appropriate semiconductor material 213B, such as silicon, which may act as a channel material and which may receive a corresponding type of strain, depending on the characteristics of the surrounding semiconductor alloy 207. Thereafter, the mask layer 210 may be removed on the basis of any appropriate process technique, such as selective etching, CMP and the like, while a substantially planar surface topography may also be obtained. Consequently, after this process sequence, the semiconductor layer 213A may be exposed and may be available, together with the planarized and exposed semiconductor material 213B, for the further processing, thereby offering a high degree of process compatibility with conventional process techniques in forming a gate insulation material and a respective gate electrode.

Figure 2F:
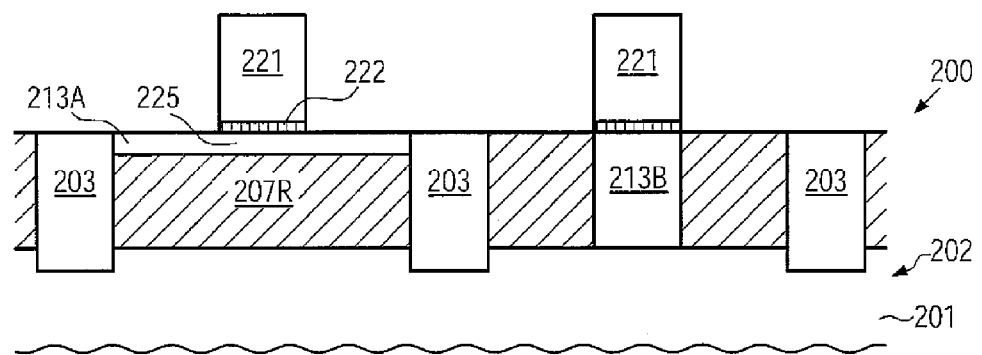

FIG. 2f schematically illustrates the semiconductor device 200 at a further advanced manufacturing stage, wherein gate electrodes 221 of respective first and second transistors are formed on respective gate insulation layers 222, which separate the corresponding gate electrodes 221 from respective channel regions 225. As previously explained, the respective channel regions 225 may have different types of strain for the first and second active regions 205A, 205B, depending on the type of semiconductor alloy 207 in the first and second active regions 205A, 205B.

Consequently, by forming the semiconductor layer 213A and in the central region 213B in separate epitaxial growth processes, an enhanced degree of flexibility may be provided, since the respective growth parameters may be specifically selected in order to obtain a desired process result. For example, the semiconductor material 213B may be grown so as to include a specified dopant species for adapting specific transistor characteristics. Since the individual deposition processes 212A, 212B are decoupled from each other, the corresponding amount of excess material desired may be individually adjusted, thereby also reducing the complexity of a subsequent process step for removing any excess material and planarizing the surface topography.

With reference to FIGS. 3a-3g, further illustrative embodiments will now be described in more detail, in which different types of strain may be generated on the basis of a single type of semiconductor alloy, wherein additionally an increased alignment accuracy of gate electrodes with respect to the previously grown semiconductor material may be achieved.

Figure 3A:
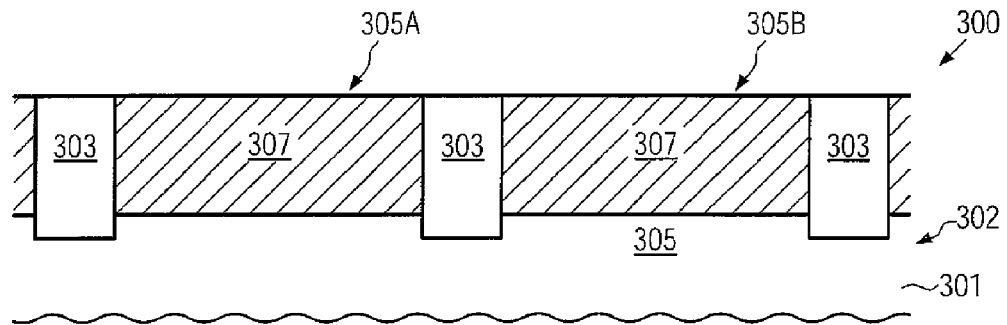
FIGS. 3a-3h schematically illustrate cross-sectional views of a semiconductor device during various manufacturing stages for forming differently strained active regions and respective gate electrodes, wherein the gate electrodes are formed on the basis of a mask layer in accordance with yet other illustrative embodiments.

FIG. 3a schematically illustrates a semiconductor device 300 comprising a substrate 301 having formed thereabove a semiconductor layer 302, in which respective isolation structures 303 define a first active region 305A and a second active region 305B. Moreover, a respective semiconductor alloy 307 may be formed on a respective template layer 305, which may represent a residual material of the semiconductor layer 302. With respect to the components described so far, the same criteria apply as previously explained for the semiconductor devices 100 and 200. Thus, the semiconductor alloy 307 may comprise any appropriate species for forming a semiconductor alloy, which, in combination with the silicon-based material of the semiconductor layer 302, may exhibit a desired lattice mismatch that may be used for generating different types of strain, as is previously explained. The semiconductor alloy 307 may, in some illustrative embodiments, be formed on the basis of selective etch techniques and epitaxial growth processes, as is previously described. In other cases, the alloy 307 may be formed on the basis of implantation and anneal sequences as is described with reference to FIG. 2a.

Figure 3B:
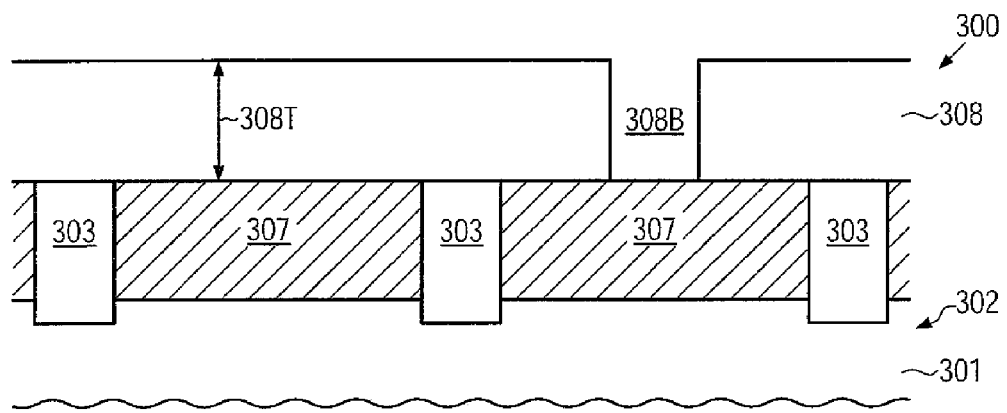

FIG. 3b schematically illustrates the semiconductor device 300 having formed thereon a mask layer 308, which may be comprised of any appropriate material, such as silicon nitride, silicon dioxide or any combination thereof The mask layer 308 may have an appropriate thickness 308T, which may be greater or at least equal to a desired design height of a gate electrode still to be formed above the first and the second active regions 305A, 305B. At this manufacturing stage, the mask layer 308 may comprise a respective opening 308B for exposing a central region of the semiconductor alloy 307 in the second active region 305B. With respect to a manufacturing sequence for forming the mask layer 308 as shown, any appropriate well-established techniques may be used, including, for instance, the deposition of an appropriate material, such as silicon nitride, followed by a corresponding photolithography process for patterning the layer 308 on the basis of an appropriate mask.

Figure 3C:
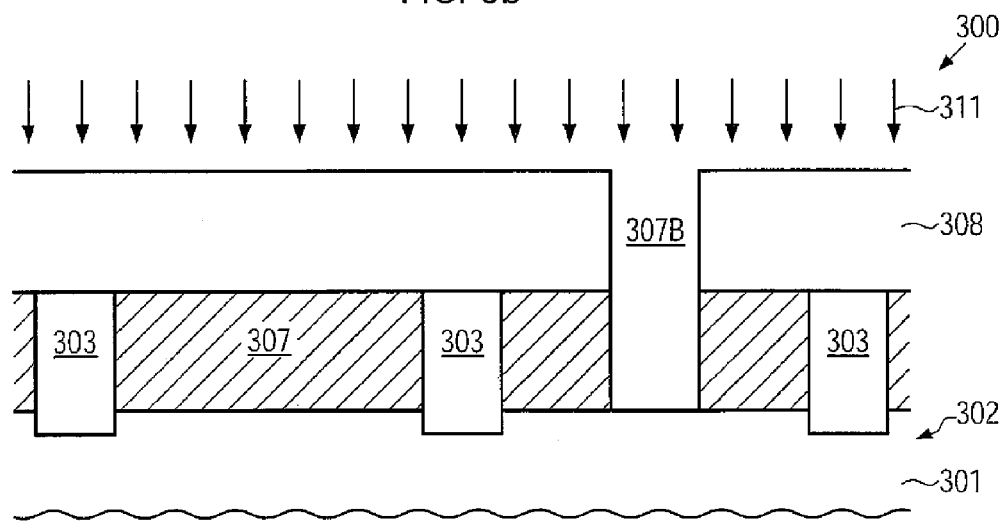

FIG. 3c schematically illustrates the semiconductor device 300 during an etch process 311 for removing a portion of the semiconductor alloy 307, thereby defining a central region 307B in the active region 305B. The etch process 311 may be designed as a highly selective etch process, in which the material of the semiconductor alloy 307 may be selectively removed with respect to the material of the etch mask 308 and selectively to the material of the isolation structures 303 in order to avoid undue material removal in isolation regions, in which a gate electrode is to be formed, in which, however, a respective trench in the isolation material may not be desirable. For example, highly selective etch recipes for silicon-based materials are available with respect to silicon nitride, silicon dioxide and many other dielectric materials.

Figure 3D:
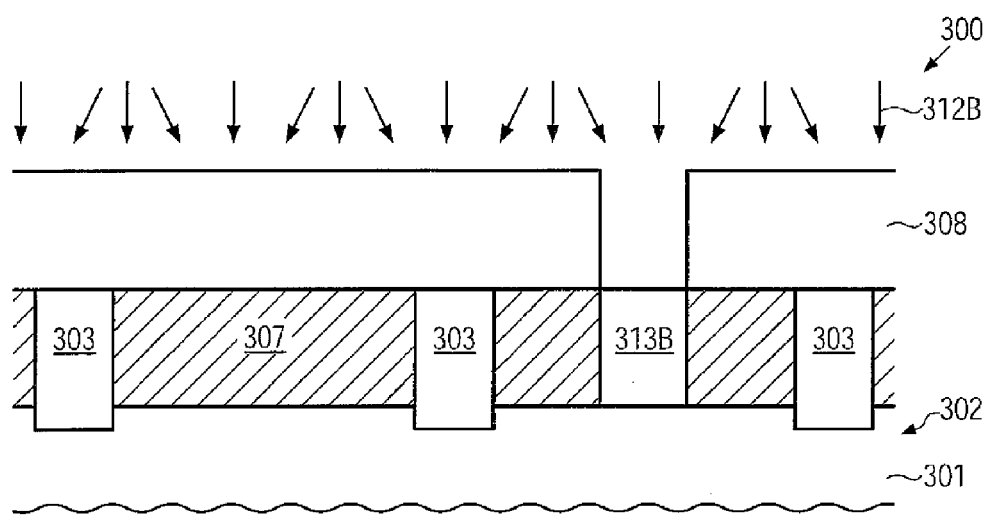

FIG. 3d schematically illustrates the semiconductor device 300 during a selective epitaxial growth process 312B for refilling the central region 307B with a corresponding semiconductor material 313B. Also in this case, the high degree of selectivity of the deposition process 312B may advantageously provide a high deposition rate within the opening 307B while substantially suppressing any deposition of semiconductor material in regions of the isolation structures 303, which may be exposed by the opening 308B. However, any slight semiconductor deposition in these areas may be compensated for by a subsequent short etch process which may not unduly affect the semiconductor material 313B that may be provided with any desired degree of excess material, while, on the other hand, any undesired semiconductor material may be removed from dielectric surfaces. As previously explained, the growth process 312B may be specifically designed with respect to transistor characteristics in the second active region 305B and may therefore, if required, include the deposition of a specific vertical dopant profile in the material 313B. Furthermore, the process 312 may be controlled so as to limit the height of the material 313B.

Figure 3E:
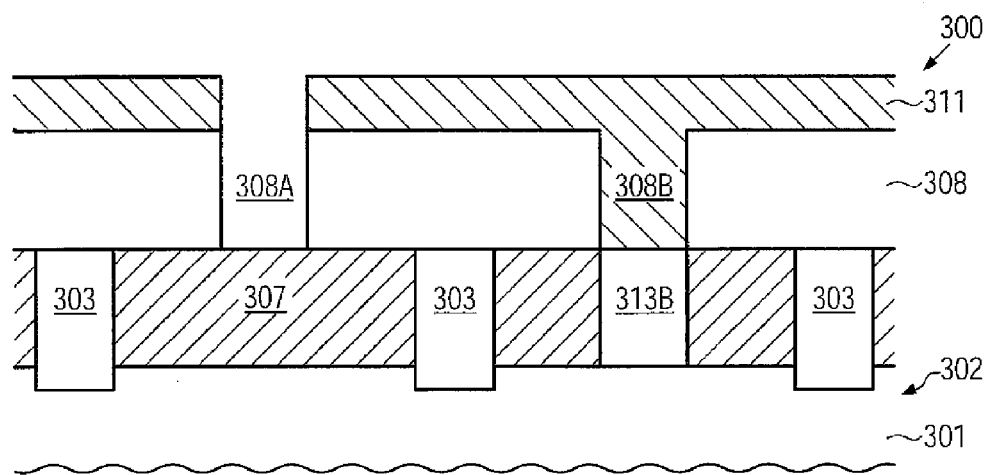

FIG. 3e schematically illustrates the semiconductor device 300 at a further advanced manufacturing stage. Here, a further mask layer 311 may be provided above the mask layer 308 so as to fill the opening 308B and expose a central portion of the first active region 305A. For instance, the mask layer 311 may be provided in the form of any appropriate material, such as a polymer material, a photo resist material and the like, which may be patterned on the basis of well-established lithography techniques. Thereafter, the mask layer 308 may be patterned on the basis of the mask layer 311 in order to form a respective opening 308A to expose the semiconductor alloy 307 in the first active region 305A. Thereafter, the mask layer 311 may be removed and the corresponding exposed portions of the first and second active regions 305A, 305B may be prepared for a subsequent selective epitaxial growth process, in which a desired amount of semiconductor material may be deposited, which may grow on the semiconductor alloy 307 in the first active region 305A, while, in the second active region 305B, the material 313B may act as a crystalline template. By forming a respective semiconductor material, the further processing of the device 300 may be based on well-established techniques, for instance a desired silicon-based surface may be available for the manufacturing of a specified gate dielectric material.

Figure 3F:
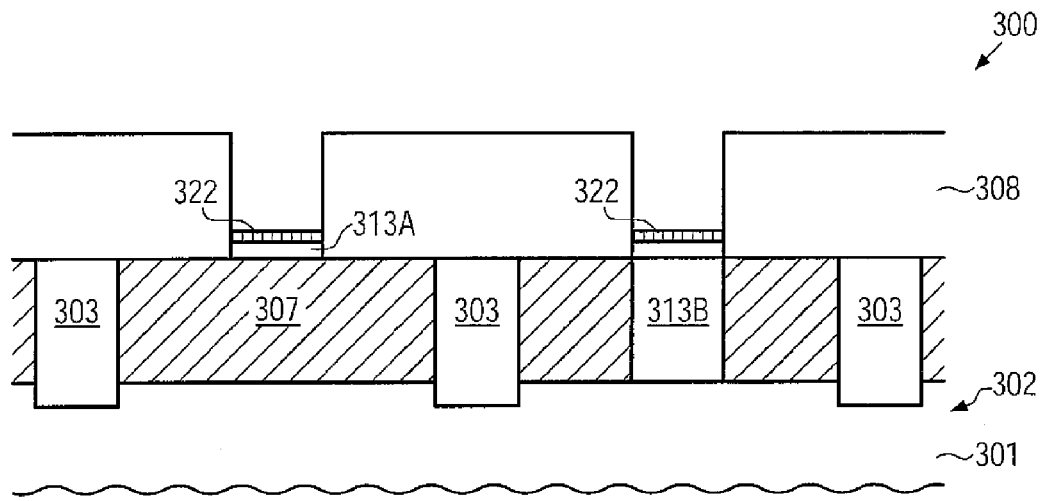

FIG. 3f schematically illustrates the semiconductor device 300 after the above-described process sequence. Hence, a semiconductor layer 313A is formed above the semiconductor alloy 307, while the height of the material 313B in the second active region 305B is correspondingly increased. Furthermore, respective gate insulation layers 322 may be formed on the respective semiconductor materials 313A, 313B. For instance, the gate insulation layers 322 may be formed on the basis of an oxidation process in accordance with well-established process techniques. Furthermore, as previously explained, the semiconductor layer 313A may exhibit a desired type of strain therein due to the presence of the semiconductor alloy 307, while the material 313B may exhibit a different type of strain due to the fact that it is enclosed by the semiconductor alloy 307.

Figure 3G:
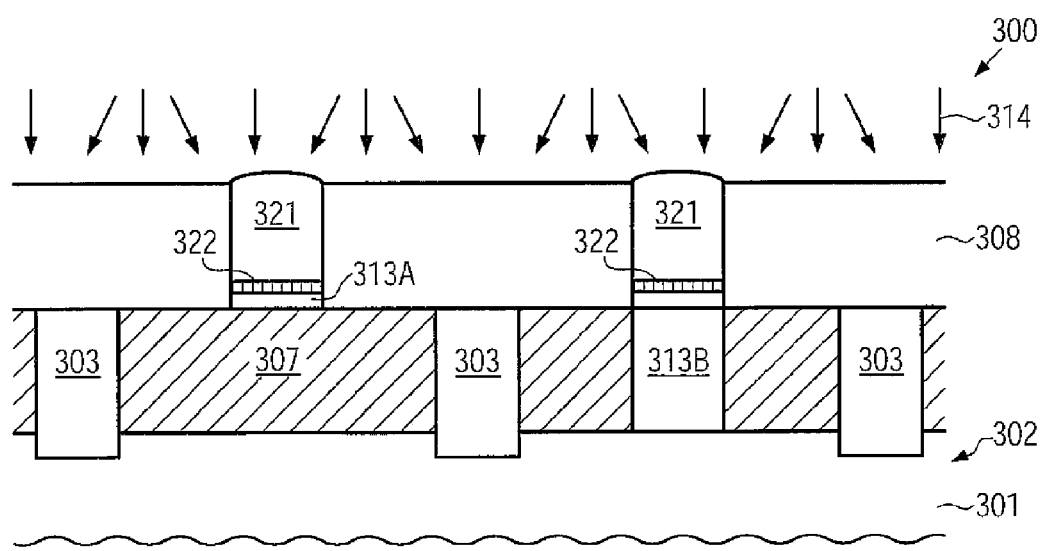

FIG. 3g schematically illustrates the semiconductor device 300 at a further advanced manufacturing stage. As shown, the device 300 is subjected to a deposition process 314 for filling in an appropriate gate electrode material into the openings 308A, 308B, thereby forming respective gate electrodes 321. Consequently, the gate electrode 321 formed above the second active region 305B is "self-aligned" to the corresponding central region including the semiconductor material 313B. The deposition process 314 may, in some embodiments, be designed as a moderately selective deposition process, in which the deposition rate on the dielectric material of the respective gate insulation layer 322, and also a material of exposed portions of the isolation structures 303, may be more pronounced compared to a deposition rate on the mask layer 308. In other illustrative embodiments, any appropriate deposition process may be performed that exhibits a high gap filling capability, wherein any excess material may be removed on the basis of CMP and the like. For instance, a low pressure CVD process may be used for depositing polycrystalline silicon within the openings 308A, 308B, wherein excess material may be removed by CMP, wherein the mask layer 308 may also act as an efficient CMP stop layer. Thereafter, the mask layer 308 may be removed by a selective etch process, for instance on the basis of hot phosphoric acid and the like, in order to expose the gate electrodes 321. Subsequently, the further processing may be continued by forming respective spacer elements and incorporating a desired dopant species into the respective active regions 305A, 305B.

Figure 3H:
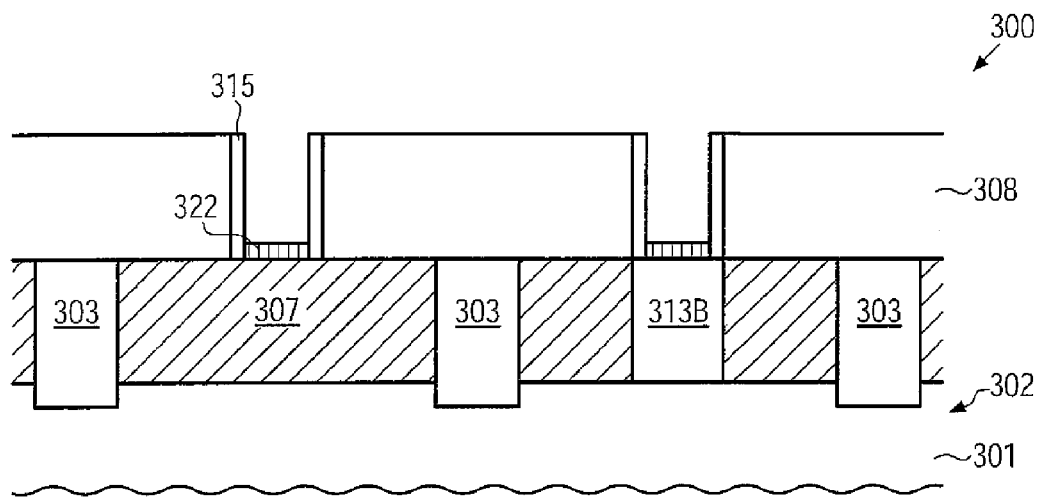

FIG. 3h schematically illustrates the semiconductor device 300 according to a further illustrative embodiment, in which respective sidewall spacers 315 may be formed within the openings 308A, 308B prior to the deposition of the gate electrode material. The sidewall spacers 315 may be formed from a material having a high etch selectivity with respect to the material of the mask layer 308, thereby providing an enhanced integrity of the gate electrode material during the removal of the mask layer 308. For this purpose, an appropriate material, such as silicon dioxide, may be conformally deposited and may subsequently be anisotropically etched, thereby removing the material from horizontal portions while maintaining the sidewall spacers 315. Thereafter, any cleaning processes may be performed and subsequently the device 300 may be subjected to a manufacturing sequence for forming the gate insulation layers 322, which may comprise an oxidation process and/or a deposition process as previously explained. Thereafter, the deposition process 314 may be performed in order to obtain the gate electrode 321. The spacers 315 may be formed with any appropriate thickness in order to define the finally desired gate length of the gate electrode 321. In this way, the gate length may finally be tuned on the basis of a deposition process rather than on the basis of the preceding lithography process for patterning the openings 308A, 308B.

In still other illustrative embodiments, the patterning of the respective openings 308A, 308B (FIGS. 3b, 3e) may also comprise one or more spacer forming processes in order to relax any constraints imposed on the associated photolithography process, thereby enabling a significant improvement of the overall resolution of the involved patterning processes. For example, the opening 308B (FIG. 3b) may be formed in a first stage on the basis of photolithography, followed by one or more depositions and anisotropic etch steps in order to obtain the finally desired width of the corresponding opening 308B. Consequently, the finally obtained gate length may be substantially determined on the basis of deposition processes, thereby extending the capability of the gate patterning process. Similarly, the opening 308A may be formed on the basis of one or more deposition and anisotropic etch processes. Consequently, in addition to a high self-aligned process technique for aligning the gate electrode 321 with respect to the semiconductor material 313B, the corresponding patterning process for the gate electrodes may be enhanced by using conformal deposition techniques in combination with anisotropic etch processes.

After forming the spacers 315 and filling the openings 308A, 308B with the gate electrode material and after any processes for removing excess material and planarizing the surface topography, the mask layer 308 may be reliably removed, wherein the sidewalls of the gate electrodes 321 are reliably protected by the spacers 315 in order to reduce any material corrosion thereof. If desired, the height difference between the semiconductor alloy 307 and the respective semiconductor materials 313A and 313B may be reduced or may be compensated for or overcompensated for by performing an additional selective epitaxial growth process, thereby providing a substantially continuous semiconductor material in the first and the second active regions 305A, 305B. Thereafter, the further processing may be continued as is described above.

As a consequence, the illustrative embodiments described with reference to FIGS. 1a-3h may provide an efficient strain-inducing mechanism for P-channel transistors and N-channel transistors on the basis of a single type of semiconductor alloy, while nevertheless maintaining a high degree of process compatibility for the formation of a gate dielectric, wherein, in some cases, even an enhanced patterning capability with respect to a desired gate length may be accomplished.

With reference to FIGS. 4a-4e, further illustrative embodiments will now be described, in which a substantially continuous semiconductor alloy may be formed in one active region, while, in another active region, a well-established process sequence for forming embedded semiconductor alloys, such as silicon/germanium, may be applied.

Figure 4A:
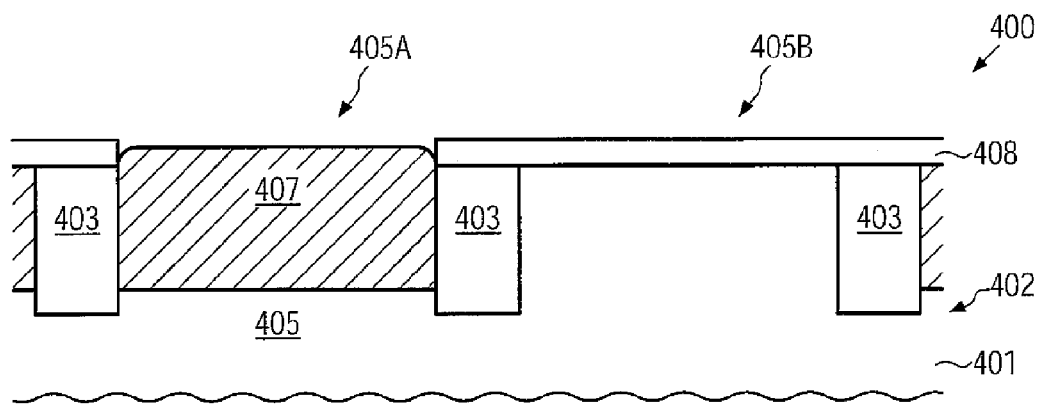
FIGS. 4a-4e schematically illustrate cross-sectional views of a semiconductor device during various manufacturing stages in forming differently strained active regions, wherein a respective semiconductor alloy may be formed in different manufacturing stages according to further illustrative embodiments.

FIG. 4a schematically illustrates a semiconductor device 400, which may comprise a substrate 401 having formed thereabove a semiconductor layer 402, in which respective isolation structures 403 may define a first active region 405A and a second active region 405B. Regarding the components described so far, the same criteria apply as previously described with reference to the semiconductor devices 100, 200 and 300. Furthermore, the device 400 may comprise a semiconductor alloy 407 formed in the first active region 405A on the basis of a template layer 405. In one illustrative embodiment, the semiconductor alloy 407 may be comprised of silicon/germanium, while, in other embodiments, other appropriate materials may be used, as previously described.

The semiconductor alloy 407 may be formed on the basis of a corresponding mask layer 408 which may be used for selectively recessing the first active region 405A and subsequently refilling the region 405A by the semiconductor alloy on the basis of a selective epitaxial growth process. Since the semiconductor alloy 407 may be individually provided in the first active region 405A, a corresponding composition with respect to concentration profile, dopant content and the like may be specifically designed in order to obtain the desired transistor characteristics in the first active region 405A. For example, a certain amount of dopant concentration may be provided in the semiconductor alloy 407, wherein the dopant concentration may be varied with height as demanded by device requirements. Similarly, the vertical concentration of an atomic species, such as the germanium content, may be adapted in accordance with device requirements in order to obtain the desired strain profile. After the selective epitaxial growth process or any other process for forming the semiconductor alloy 407, for instance an ion implantation process as previously explained, the mask layer 408 may be removed and the resulting surface topography may be planarized, if required.

Figure 4B:
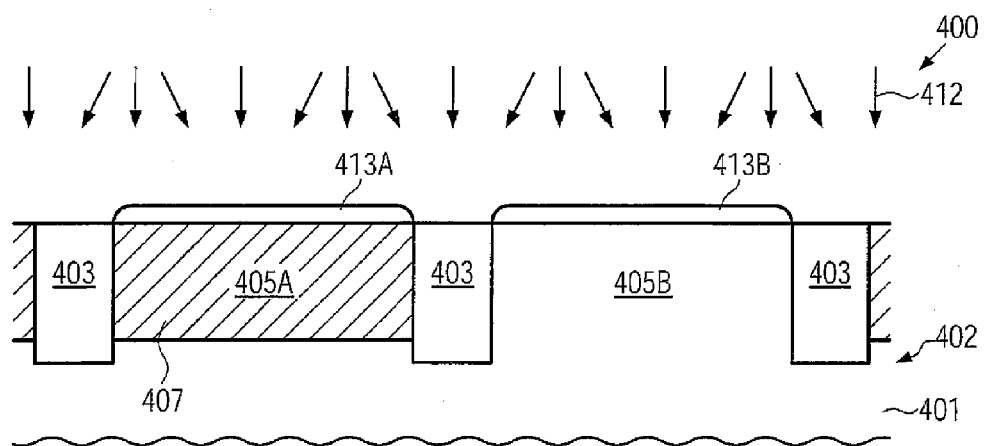

FIG. 4b schematically illustrates the semiconductor device 400 during a selective epitaxial growth process 412 for forming a semiconductor layer 413A and 413B on the first and second active regions 405A, 405B. In some illustrative embodiments, prior to the deposition process 412, the material in the active regions 405A, 405B may be selectively recessed in order to provide a substantially planar surface topography after the deposition process 412. In other illustrative embodiments, the surface topography of the device 400 as shown in FIG. 4b may be planarized, if desired, by depositing any appropriate dielectric material, such as silicon nitride, silicon dioxide and the like, and removing any excess material, thereby reliably exposing the layers 413A, 413B while also obtaining a planar surface topography.

Figure 4C:
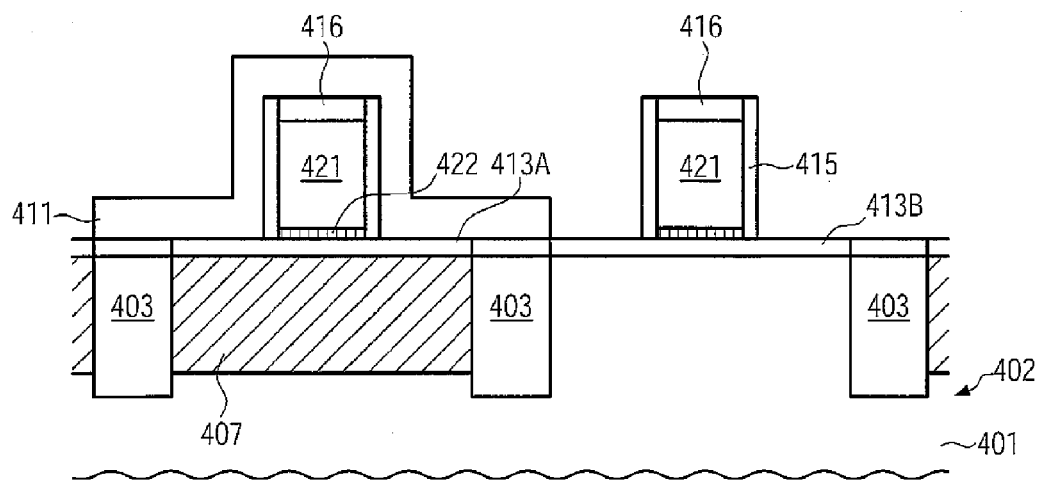

FIG. 4c schematically illustrates the semiconductor device 400 at a further advanced manufacturing stage. As shown, respective gate electrodes 421 are formed on corresponding gate insulation layers 422 above the respective active regions 405A, 405B, wherein the gate electrode 421 in the second active region 405B may be encapsulated by a respective spacer 415 and an appropriate cap layer 416. On the other hand, the first active region 405A may be completely covered by a mask layer 411.

The semiconductor device 400 as shown in FIG. 4c may be formed on the basis of the following processes. Based on the semiconductor layers 413A, 413B, the gate electrodes 421 and the gate insulation layers 422 may be formed on the basis of well-established CMOS techniques, wherein the layers 413A, 413B provide a high degree of process compatibility. Furthermore, during the patterning of the gate electrodes 421, the respective cap layers 416 may also be formed and, thereafter, the sidewall spacers 415 may be formed on the basis of well-established techniques. Next, the mask layer 411 may be formed and may be patterned on the basis of well-established lithography techniques.

Figure 4D:
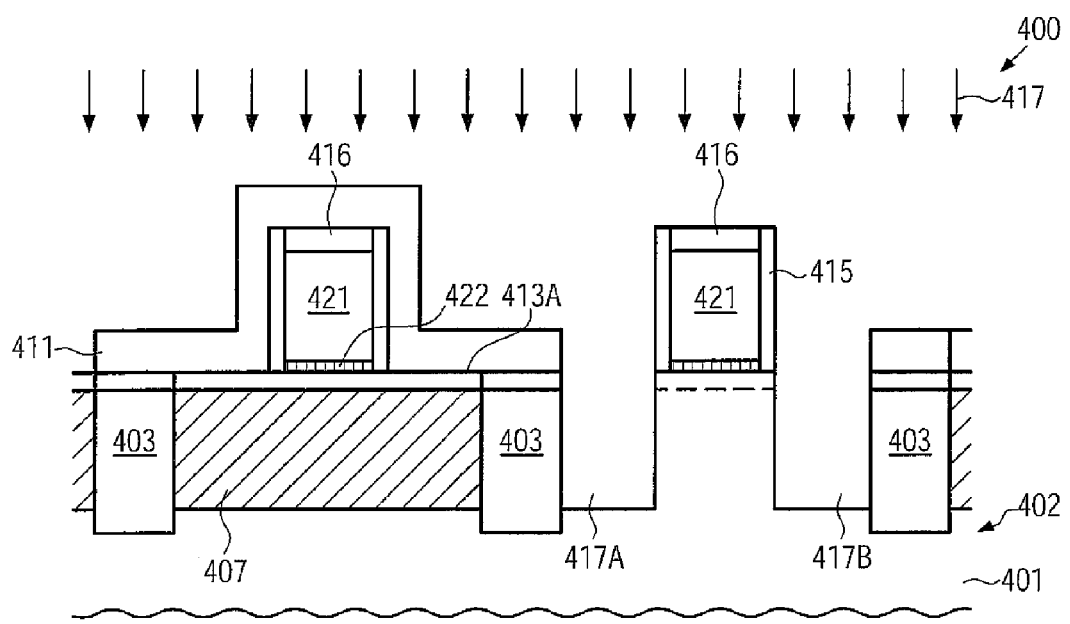

FIG. 4d schematically illustrates the semiconductor device 400 during an etch process 417 for creating respective recesses 417A, 417B adjacent to the gate electrode 421 with a corresponding offset defined by the sidewall spacers 415. Thereafter, the device 400 may be prepared for the selective epitaxial deposition of a semiconductor alloy in order to induce the desired type of strain in the remaining portion of the second active region 405B. In some illustrative embodiments, substantially the same semiconductor alloy may be deposited in the recesses 417A, 417B as is provided for the material 407 in the first active region 405A. For example, respective selective epitaxial growth techniques for silicon/germanium are well established in the art and may be used for refilling the recesses 417A, 417B. During the corresponding material deposition, any appropriate germanium content and dopant concentration may be incorporated as is required by device characteristics. Thus, even though the same type of semiconductor alloy may be used for the first and second active regions 405A, 405B, nevertheless, the corresponding characteristics may be individually adapted. Hence, a high degree of flexibility in appropriately designing the strain characteristics in the first and second active regions 405A, 405B may be accomplished. In other illustrative embodiments, even different types of semiconductor alloys may be used, depending on the overall device requirements.

Figure 4E:
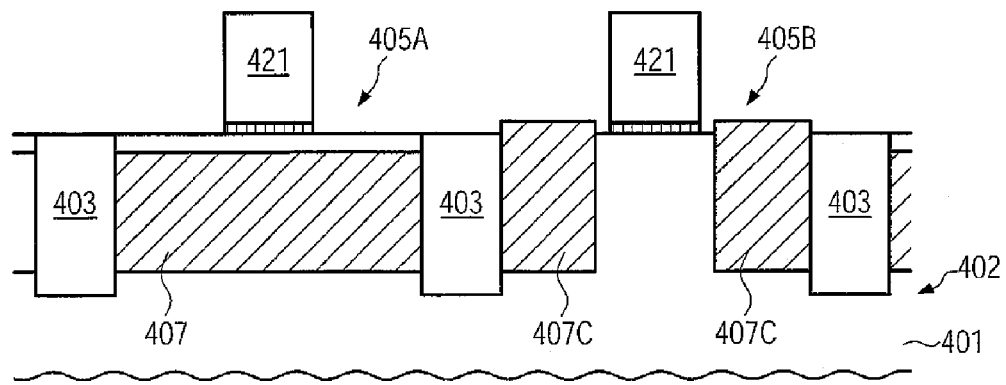

FIG. 4e schematically depicts the semiconductor device 400 at a further advanced manufacturing stage. Here, a respective semiconductor alloy 407C is formed in the respective recesses 407A, 407B, wherein, depending on device requirements, a certain degree of excess height may be provided with respect to the central portion of the semiconductor material 413B. Furthermore, the mask layer 411 as well as the sidewall spacers 415 and the cap layers 416 may be removed. To this end, highly selective etch recipes may be used, which are well established in the art. Based on the device configuration as shown in FIG. 4e, the further processing may be continued on the basis of well-established strategies, i.e., respective drain and source regions may be defined in the first and second active regions 405A, 405B in order to complete the transistor structures therein.

As a result, the subject matter disclosed herein provides a technique for individually enhancing the transistor performance of N-channel transistors and P-channel transistors on the basis of embedded semiconductor alloy material providing a desired type of strain at least in a portion of a respective channel region. In some illustrative embodiments, a single type of semiconductor alloy may be used in combination with a silicon-based architecture, wherein, irrespective of whether an SOI bulk configuration is considered, a substantially continuous semiconductor alloy may be formed in one of the active regions, for instance by providing the respective semiconductor alloy between the corresponding isolation structures and forming a respective capping layer of the initial semiconductor material, thereby providing a high degree of process compatibility with conventional approaches. In other active regions, the semiconductor alloy may be appropriately patterned so as to fill the silicon-based material in a central portion of the active region, thereby creating a different type of strain therein while nevertheless providing high process compatibility with conventional gate patterning and gate dielectric formation processes, at least in the central portion of the active region. Consequently, enhanced overall device performance may be obtained without unduly contributing to process complexity. In one illustrative embodiment, the semiconductor alloy may be comprised of silicon/germanium, wherein the substantially continuous silicon/germanium alloy may provide, in combination with an overlying semiconductor layer based on silicon, performance gain for N-channel transistors, while the patterned silicon/germanium alloy in the active region of the P-channel transistor may provide enhanced hole mobility therein. In other illustrative embodiments, a semiconductor alloy having a smaller natural lattice constant compared to silicon may be used, thereby inducing inverse strain characteristics compared to the silicon/germanium alloy. In some illustrative embodiments, the formation of the semiconductor alloy in the first and second active regions may be performed in a common process sequence, thereby providing reduced process complexity, while, in other illustrative embodiments, enhanced flexibility on designing the respective characteristics with respect to dopant concentration, type of alloy, concentration gradients therein, may be achieved by separately providing a respective semiconductor alloy in different transistor types. For this purpose, in some illustrative embodiments, efficient selective epitaxial growth techniques may be used in combination with selective etch steps for recessing one or more of the active regions in a common process and subsequently refilling the recesses with an appropriate semiconductor alloy. In still other illustrative embodiments, the semiconductor alloy may be formed on the basis of an ion implantation process, wherein appropriate pre-amorphization steps may be used in combination with advanced anneal techniques for re-crystallizing the active regions after incorporating the desired atomic species for forming the semiconductor alloy. For this purpose, substantially the same masking regimes may be used as are previously described with respect to FIGS. 1a-4e, wherein, however, instead of selectively recessing the active regions and refilling the same, a corresponding mask may be used for an implantation process without requiring a selective removal of material of the active region. Furthermore, in this case, the corresponding mask layers may be provided in the form of resist masks, thereby contributing to a reduced process complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a first transistor of a first conductivity type, the first transistor comprising a first active region having formed thereabove a first gate electrode, the first active region comprising a substantially continuous first semiconductor alloy extending laterally between an isolation structure bordering said first active region, the first active region further comprising a layer of semiconductor material formed on said first semiconductor alloy, said first semiconductor alloy generating a first type of strain in said layer of semiconductor material; and
   a second transistor of a second conductivity type, the second transistor comprising a second active region having formed thereabove a second gate electrode, the second active region comprising a second semiconductor alloy provided in a first portion and a second portion, said first and second portions being separated by a region formed from said semiconductor material and generating a second type of strain in said region, said second type of strain being opposite said first type of strain.

2. The semiconductor device of claim 1, wherein said first and second semiconductor alloys are comprised of substantially the same semiconductor alloy material.

3. The semiconductor device of claim 2, wherein said semiconductor alloy material is comprised of silicon/germanium.

4. The semiconductor device of claim 2, wherein said semiconductor alloy material is comprised of silicon/carbon.

5. The semiconductor device of claim 1, wherein said first type of strain is a tensile strain and said second type of strain is a compressive strain.

6. The semiconductor device of claim 5, wherein said first transistor represents an N-channel transistor and said second transistor represents a P-channel transistor.

7. The semiconductor device of claim 1, wherein the second gate electrode is formed substantially above the region formed from said semiconductor material between the first portion and the second portion of the second semiconductor alloy.

8. The semiconductor device of claim 1, wherein a crystalline structure of the first semiconductor alloy corresponds to a crystalline template layer.

9. The semiconductor device of claim 1, wherein a crystalline structure of the second semiconductor alloy corresponds to the crystalline template layer.

* * * * *